(12) United States Patent
Kajita

(10) Patent No.: US 9,960,762 B2
(45) Date of Patent: May 1, 2018

(54) STARTUP CIRCUIT

(71) Applicant: Azbil Corporation, Tokyo (JP)

(72) Inventor: Tetsuya Kajita, Tokyo (JP)

(73) Assignee: Azbil Corporation, Tokyo (JP)

( * ) Notice: Subject to any disclaimer, the term of this patent is extended or adjusted under 35 U.S.C. 154(b) by 0 days. days.

(21) Appl. No.: 15/515,410

(22) PCT Filed: Aug. 31, 2015

(86) PCT No.: PCT/JP2015/074621
§ 371 (c)(1),
(2) Date: Mar. 29, 2017

(87) PCT Pub. No.: WO2016/052042
PCT Pub. Date: Apr. 7, 2016

(65) Prior Publication Data
US 2017/0230044 A1 Aug. 10, 2017

(30) Foreign Application Priority Data

Sep. 29, 2014 (JP) .................................. 2014-198156

(51) Int. Cl.
*H02M 1/36* (2007.01)
*H03K 17/22* (2006.01)
(Continued)

(52) U.S. Cl.
CPC ............. *H03K 17/22* (2013.01); *G05F 3/26* (2013.01); *G05F 3/30* (2013.01); *H02M 1/36* (2013.01); *H02M 3/04* (2013.01)

(58) Field of Classification Search
CPC ............ H02M 1/00; H02M 1/38; H02M 1/36; H02M 3/04; G05F 1/573; G05F 3/30; G05F 3/26; G05F 5/00
(Continued)

(56) References Cited

U.S. PATENT DOCUMENTS

| 6,429,631 B2 * | 8/2002 | Inaba ..................... G05F 1/575 323/277 |
| 2006/0087367 A1 | 4/2006 | Inoue |

(Continued)

FOREIGN PATENT DOCUMENTS

| JP | 2002064374 A | 2/2002 |
| JP | 2006121448 A | 5/2006 |
| JP | 2012248995 A | 12/2012 |

OTHER PUBLICATIONS

International Search Report (English and Japanese) and PCT Written Opinion (Japanese) dated Nov. 17, 2015 issued in corresponding PCT International Application No. PCT/JP2015/074621.

*Primary Examiner* — Adolf Berhane
(74) *Attorney, Agent, or Firm* — Oblon, McClelland, Maier & Neustadt, L.L.P.

(57) ABSTRACT

Disclosed is a startup circuit comprises a current path comprising a circuit including a P-channel MOS transistor, a P-channel MOS transistor, and an N-channel MOS transistor connected in series. After a constant current circuit is started, the N-channel MOS transistor is turned on, an operating current is fed through the current path, and an N-channel MOS transistor is turned off to cut off a startup current. After the startup current is cut off, the gate voltage of the P-channel MOS transistor is controlled by the voltage (bias voltage during operation of the constant current circuit) of a node, a drain-source voltage of the P-channel MOS transistor is reduced, and the operating current flowing through the current path is limited.

4 Claims, 10 Drawing Sheets

(51) Int. Cl.
*G05F 3/26* (2006.01)
*G05F 3/30* (2006.01)
*H02M 3/04* (2006.01)

(58) Field of Classification Search
USPC .................. 323/276–278, 299, 371, 901
See application file for complete search history.

(56) References Cited

U.S. PATENT DOCUMENTS

| | | | |
|---|---|---|---|
| 2008/0007325 A1 | 1/2008 | Inoue | |
| 2010/0244804 A1* | 9/2010 | Zong | H02M 1/36 323/299 |
| 2012/0134707 A1* | 5/2012 | Inukai | G03G 15/80 399/88 |
| 2012/0163047 A1* | 6/2012 | Kubota | H02M 1/36 363/49 |
| 2015/0194875 A1* | 7/2015 | Jutras | H02M 1/36 363/49 |

* cited by examiner

STARTUP CIRCUIT

CROSS-REFERENCE TO RELATED APPLICATIONS

This is a U.S. national phase application under 35 U.S.C. § 371 of International Patent Application No. PCT/JP2015/074621, filed Aug. 31, 2015, and claims benefit of priority to Japanese Patent Application No. 2014-198156, filed Sep. 29, 2014. The entire contents of these applications are hereby incorporated by reference.

TECHNICAL FIELD

The present invention relates to a startup circuit for supplying a startup current to a constant current circuit for generating a constant current when starting the supply of a power supply voltage.

BACKGROUND

Conventionally, in a constant current circuit (constant current source) using an electropotential difference caused by a source resistor of a current mirror, a startup circuit is provided to surely start a constant current circuit when the supply of a power supply voltage is started so that the startup circuit supplies a startup current to the constant current circuit.
Necessity to Supply a Startup Current to a Constant Current Circuit FIG. 5 illustrates an example of a constant current circuit using an electropotential difference caused by the source resistor of a current mirror. This constant current circuit 101 includes N-channel MOS transistors N1 and N2, P-channel MOS transistors P1 and P2, and a resistor R1. The N-channel MOS transistor N1, the P-channel MOS transistor P1, and the resistor R1 are connected in series between a supply line L1 and a ground line L2 of a power supply voltage VDD to form a first current path S1 and an N-channel MOS transistor N2 and the P-channel MOS transistor P2 are connected in series to form a second current path S2.

In addition, in the constant current circuit 101, gates of the N-channel MOS transistors N1 and N2 are connected to each other. Gates of the P-channel MOS transistors P1 and P2 are connected to each other. A drain and the gate of the N-channel MOS transistor N2 are connected to each other. A drain and the gate of the P-channel MOS transistor P1 are connected to each other.

By adopting such a circuit configuration, the constant current circuit 101 has a feedback circuit in which the value of a current I flowing through the first current path S1 is identical to the value of a current I flowing through the second current path S2 by a first current mirror circuit including the N-channel MOS transistors N1 and N2 and a second current mirror circuit including the P-channel MOS transistors P1 and P2. The current I flowing through the first current path S1 is referred to below as the "left side current mirror current IL" and the current I flowing through the second current path S2 is referred to below as the "right side current mirror current IR".

In the constant current circuit 101, the transistor sizes of the N-channel MOS transistors N1 and N2 and the resistance value of the resistor R1 are selected so that, for example, the left side current mirror current IL and the right side current mirror current IR become stable at 0.5 µA. However, as illustrated in FIG. 6, when starting from the point at which the power supply voltage VDD is zero volts, the constant current circuit 101 has the stable point (point at which the current is zero) at which no current flows through both current paths in addition to the stable point at which the left side current mirror current IL and the right side current mirror current IR become identical and stable. FIG. 6 indicates, as a stable point A, the point at which the left side current mirror current IL and the right side current mirror current IR become identical and stable and indicates, as a stable point B, the point at which no current flows through both current paths.

Normally, both currents rarely become stable at the point at which no current flows due to noise or imbalance between the two current paths S1 and S2. However, depending on conditions such as a temperature, a process, and a power source, they may become stable at the point at which no current flows and, once they become stable at the point at which no current flows, the constant current circuit 101 never starts again. Therefore, it is necessary to reach the stable point A by forcibly feeding a current through the N-channel MOS transistor N2 or the P-channel MOS transistor P1 only when the supply of the power supply voltage VDD to the constant current circuit 101 is started. The current necessary for reaching the stable point A is referred to as a "startup current". In addition, the circuit for supplying the startup current is referred to as a "startup circuit".
Conventional Startup Circuit

Conventional Example 1

FIG. 7 illustrates a constant current circuit 102 (conventional example 1) provided with a conventional typical startup circuit 201.

In this example, the constant current circuit 102 includes the P-channel MOS transistors P1 and P2, the N-channel MOS transistors N1 and N2, and the resistor R1. The P-channel MOS transistor P1, the N-channel MOS transistor N1, and the resistor R1 connected in series form the first current path S1 between the supply line L1 and the ground line L2 of the power supply voltage VDD. The P-channel MOS transistor P2 and the N-channel MOS transistor N2 connected in series form the second current path S2 between the supply line L1 and the ground line L2 of the power supply voltage VDD.

In addition, in the constant current circuit 102, the gates of the P-channel MOS transistors P1 and P2 are connected to each other. The gates of the N-channel MOS transistors N1 and N2 are connected to each other. The gate and the drain of the P-channel MOS transistor P1 are connected to each other. The gate and the drain of the N-channel MOS transistor N2 are connected to each other.

The startup circuit 201 includes an N-channel MOS transistor N3. That is, with respect to the constant current circuit 102, the startup circuit 201 is configured by connecting the drain of the N-channel MOS transistor N3 to a connection line (node V1) between the gate and the drain of the P-channel MOS transistor P1, connecting the source of the N-channel MOS transistor N3 to a connection line (node V2) between the gate and the drain of the N-channel MOS transistor N2, and connecting the gate of the N-channel MOS transistor N3 to a connection line (node V3) between the drain of the P-channel MOS transistor P1 and the drain of the N-channel MOS transistor N1.

In the constant current circuit 102 in which the startup circuit 201 is provided, when the supply of the power supply voltage VDD to the constant current circuit 102 is started, a startup current Is flows through the path including the P-channel MOS transistor P1, the N-channel MOS transistor N3, and the N-channel MOS transistor N2.

That is, when supply of the power supply voltage VDD to the constant current circuit 102 is started, since a voltage (a gate voltage of the N-channel MOS transistor N2) of the node V2 rises in the path including the diode-connected P-channel MOS transistor P1 and the diode-connected N-channel MOS transistor N3, the N-channel MOS transistor N2 is turned on and a current surely flows through the N-channel MOS transistor N2.

When the constant current circuit 102 starts by receiving the supply of the startup current Is and the left side current mirror current IL flows through the path S1 including the P-channel MOS transistor P1, the N-channel MOS transistor N1, and the resistor R1, a voltage (that is, a gate voltage of the N-channel MOS transistor N3) of the node V3 drops and the N-channel MOS transistor N3 turns off, thereby cutting off the supply of the startup current Is to the constant current circuit 102.

Conventional Example 2

FIG. 8 illustrates a constant current circuit (conventional example 2) including another example of the conventional startup circuit. In this example, a startup circuit 202 including an inverter circuit INV1 and the N-channel MOS transistor N3 is provided for the constant current circuit 102.

In this startup circuit 202, the drain of the N-channel MOS transistor N3 is connected to the connection line (node V1) between the gate of the P-channel MOS transistor P1 and the gate of the P-channel MOS transistor P2. The source of the N-channel MOS transistor N3 is connected to the ground line L2. In addition, the gate of the N-channel MOS transistor N3 is connected to the output side of the inverter circuit INV1. The input side of the inverter circuit INV1 is connected to the connection line (node V2) between the gate of the N-channel MOS transistor N1 and the gate of the N-channel MOS transistor N2.

In the constant current circuit 102 for which the startup circuit 202 is provided, the startup current Is flows through the path including the P-channel MOS transistor P1 and the N-channel MOS transistor N3 when the supply of the power supply voltage VDD to the constant current circuit 102 is started.

That is, when the supply of the power supply voltage VDD to the constant current circuit 102 is started, the N-channel MOS transistor N3 is turned on by receiving a high level gate voltage from the inverter circuit INV1 and a current flows through the path including the diode-connected P-channel MOS transistor P1 and the diode-connected N-channel MOS transistor N3. This turns on the P-channel MOS transistor P2 and surely feeds a current through the P-channel MOS transistor P2.

When the constant current circuit 102 starts by receiving the supply of the startup current Is and the right side current mirror current IR flows through the path including the P-channel MOS transistor P2 and the N-channel MOS transistor N2, the voltage of the node V2 rises and the output of the inverter circuit INV1 is inverted from the high level to the low level and the N-channel MOS transistor N3 is turned off, thereby cutting off the supply of the startup current Is to the constant current circuit 102.

Conventional Example 3

FIG. 9 illustrates a constant current circuit (conventional example 3) including another example of the conventional startup circuit (see, for example, Japanese Unexamined Patent Publication No. 2002-064374 A). In this example, a startup circuit 203 including a P-channel MOS transistor P3, the N-channel MOS transistor N3, and an N-channel MOS transistor N4 is provided for a constant current circuit 102'.

In this startup circuit 203, the P-channel MOS transistor P3 and the N-channel MOS transistor N3 are connected in series between the supply line L1 and the ground line L2 of the power supply voltage VDD. The gate of the P-channel MOS transistor P3 and the gate of the N-channel MOS transistor N3 are connected to the connection line (node V3) between the gate of the N-channel MOS transistor N1 and the gate of the N-channel MOS transistor N2.

In addition, a gate of a N-channel MOS transistor N4 is connected to the connection line (node V1) between the drain of the P-channel MOS transistor P3 and the drain of the N-channel MOS transistor N3. A drain of the N-channel MOS transistor N4 is connected to the connection line (node V2) between the drain of the P-channel MOS transistor P1 and the drain of the N-channel MOS transistor N1. A source of the N-channel MOS transistor N4 is grounded.

In the constant current circuit 102' in this example, the drain and the gate of the P-channel MOS transistor P1 are connected to each other. In addition, the drain and the gate of the N-channel MOS transistor N2 are connected to each other.

In the constant current circuit 102' for which the startup circuit 203 is provided, the startup current Is flows through the path including the P-channel MOS transistor P1 and the N-channel MOS transistor N4 when the supply of the power supply voltage VDD to the constant current circuit 102' is started.

That is, before the power is turned on, the voltages of the nodes V1, V2, and V3 are close to 0 V. Therefore, when the supply of the power supply voltage VDD to the constant current circuit 102' is started, the P-channel MOS transistor P3 is turned on, a voltage of the node V1 (that is, a gate voltage of the N-channel MOS transistor N4) rises, and the N-channel MOS transistor N4 is turned on. This feeds a current through the path including the diode-connected P-channel MOS transistor P1 and the diode-connected N-channel MOS transistor N4 and surely feeds a current through the P-channel MOS transistor P1.

When the constant current circuit 102' starts by receiving the supply of the startup current Is and the right side current mirror current IR flows through the path including the resistor R1, the P-channel MOS transistor P2, and the N-channel MOS transistor N2, a voltage (a gate voltage of the N-channel MOS transistor N3) of the node V3 rises and the N-channel MOS transistor N3 is turned on, thereby feeding a current Ix through the path including the P-channel MOS transistor P3 and the N-channel MOS transistor N3. This reduces the voltage (that is, the gate voltage of the N-channel MOS transistor N4) of the node V1, turns off the N-channel MOS transistor N4, and cuts off the supply of the startup current Is to the constant current circuit 102'.

In the startup circuit 203, the path including the P-channel MOS transistor P3 and the N-channel MOS transistor N3 becomes a third current path S3 and a current Ix for turning off the N-channel MOS transistor N4 flows through the third current path S3 as an operating current. This operating current Ix continues to flow even after starting the constant current circuit 102' to maintain the off state of the N-channel MOS transistor N4.

In the startup circuit 201 of the conventional example 1 illustrated in FIG. 7, to normally operate the constant current circuit 102, it is necessary to cut off the supply of the startup current Is to the constant current circuit 102 by turning off the N-channel MOS transistor N3 after starting the constant current circuit 102.

For this purpose, in the startup circuit 201, the gate voltage of the P-channel MOS transistor P1 and the gate voltage of the N-channel MOS transistor N2 need to be set correctly so that the gate voltage of the N-channel MOS transistor N3 is lower than a source voltage.

However, in the startup circuit 201, when the use range of the power supply voltage VDD of the constant current circuit 102 is widened (for example, when the power supply voltage VDD is planned to range from 5 V to 18 V), it is not possible to set the gate voltage of the P-channel MOS transistor P1 and the gate voltage of the N-channel MOS transistor N2 so as to turn off the N-channel MOS transistor N3. Accordingly, the startup circuit 201 in the conventional example 1 cannot be used to widen the use range of the power supply voltage VDD.

In the startup circuit 202 in the conventional example 2 illustrated in FIG. 8, the N-channel MOS transistor N3 is turned on or off by the inverter circuit INV1. In the startup circuit 202, when the use range of the power supply voltage VDD of the constant current circuit 102 is wide, a threshold voltage of the inverter circuit INV1 cannot be set appropriately. Accordingly, the startup circuit 202 of the conventional example 2 cannot also be used to widen the use range of the power supply voltage VDD.

In FIG. 8, there is another method in which the N-channel MOS transistor N4 (not illustrated) is used instead of the inverter circuit INV1 and the drain of the N-channel MOS transistor N4 is connected to the power supply voltage VDD via a resistor. However, to make the gate voltage of the N-channel MOS transistor N3 a low level after starting, the drain current of the N-channel MOS transistor N4 needs to be reduced by using the resistor having significantly high resistance. Since a large area is necessary to achieve high resistance on an integrated circuit, this method is also not preferable.

Since the gate of the P-channel MOS transistor P3 is connected to the node V3 in the startup circuit 203 in the conventional example 3 illustrated in FIG. 9, a gate-source voltage Vgs of the P-channel MOS transistor P3 can be reduced as compared with the case in which the gate of the P-channel MOS transistor P3 is grounded.

Accordingly, the current supply capability of the P-channel MOS transistor P3 reduces, the voltage of the node V1 does not rise significantly even when the power supply voltage VDD rises, and the N-channel MOS transistor N4 can be turned off surely as compared with the case in which the gate of the P-channel MOS transistor P3 is grounded.

However, in the startup circuit 203 in the conventional example 3, an increase in the power supply voltage VDD is limited. That is, since the gate-source voltage Vgs of the P-channel MOS transistor P3 increases when the power supply voltage VDD rises, the current flowing through the P-channel MOS transistor P3 increases. As a result, the voltage (the gate voltage of the N-channel MOS transistor N4) of the node V1 rises and the N-channel MOS transistor N4 may not be turned off. Accordingly, the startup circuit 203 of the conventional example 3 cannot also be used to widen the use range of the power supply voltage VDD.

SUMMARY

The invention addresses the above problem with an object of providing a startup circuit capable of widening the use range of a power supply voltage.

To achieve such an object, there is provided a startup circuit for performing supply of a startup current to a constant current circuit for generating a constant current by receiving supply of a power supply voltage when starting the supply of the power supply voltage to the constant current circuit, the startup circuit including a switching element that is turned on when the supply of the power supply voltage is started and performs the supply of the startup current to the constant current circuit and a startup current cut-off circuit for cutting off the supply of the startup current to the constant current circuit by turning off the switching element after the constant current circuit is started, in which the startup current cut-off circuit has a current path through which a current for turning off the switching element flows as an operating current and an operating current limiting element for limiting the operating current flowing through the current path after the switching element is turned off since the operating current flows through the current path.

According to the invention, a switching element is turned on and a startup current is supplied to a constant current circuit when the supply of a power supply voltage is started. After the constant current circuit starts by receiving the supply of the startup current, the operating current flows through the current path to turn off the switching element, thereby cutting off the supply of the startup current to the constant current circuit. In the invention, after the switching element is turned off, the operating current flowing through the current path is limited.

In the invention, after the switching element is turned off, the operating current flowing through the current path is limited. That is, after the switching element is turned off, the operating current flowing through the current path reduces. This can surely turn off the switching element while the voltage of the node in the current path does not exceed the threshold voltage of the switching element over a wide range of power supply voltage.

The invention includes a switching element that is turned on when the supply of the power supply voltage is started and performs the supply of the startup current to the constant current circuit and a startup current cut-off circuit for cutting off the supply of the startup current to the constant current circuit by turning off the switching element after the constant current circuit is started, in which the startup current cut-off circuit has a current path through which a current for turning off the switching element flows as an operating current and an operating current limiting element for limiting the operating current flowing through the current path after the switching element is turned off since the operating current flows through the current path. Accordingly, after the switching element is turned off, the operating current flowing through the current path is limited, the voltages of nodes in the current path do not exceed the threshold voltage of the switching element over a wide range of power supply voltages, and the switching element can be surely turned off, thereby widening the use range of the power supply voltage.

DETAILED DESCRIPTION

Figure 1:
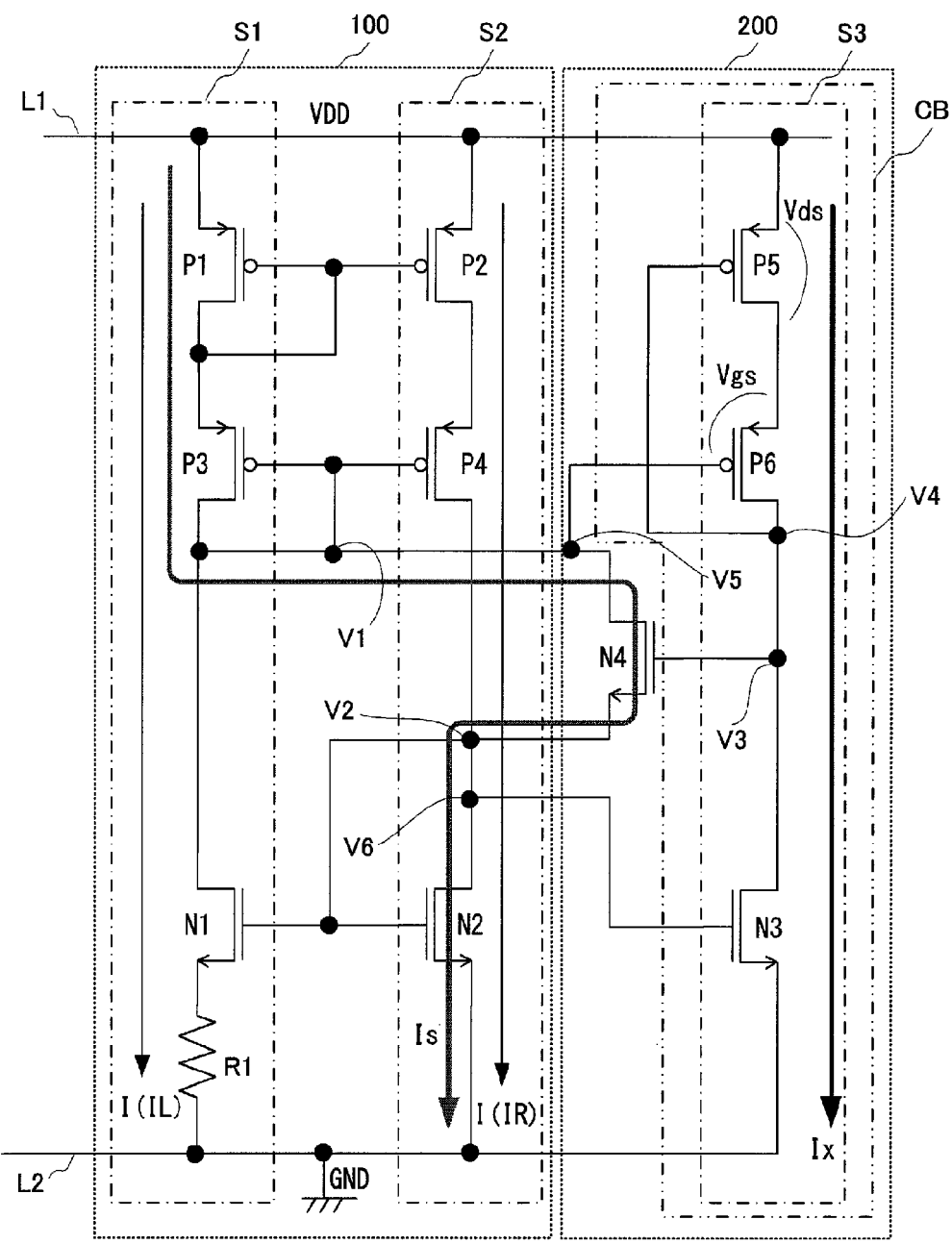
FIG. 1 illustrates a constant current circuit including a startup circuit according to an example of the invention.

An example of the invention will be described below with reference to the drawings. FIG. 1 illustrates a constant current circuit including a startup circuit according to the example of the invention.

In FIG. 1, a constant current circuit 100 includes P-channel MOS transistors P1 to P4, N-channel MOS transistors N1 and N2, and a resistor R1. The P-channel MOS transistor P1, the P-channel MOS transistor P3, the N-channel MOS transistor N1, and the resistor R1 connected in series are connected between a supply line L1 and a ground line L2 of a power supply voltage VDD to form a first current path S1. The P-channel MOS transistor P2, the P-channel MOS transistor P4, and the N-channel MOS transistor N2 connected in series are connected between the supply line L1 and the ground line L2 of the power supply voltage VDD to form a second current path S2.

In addition, in the constant current circuit 100, gates of the P-channel MOS transistors P1 and P2 are connected to each other. Gates of the P-channel MOS transistors P3 and P4 are connected to each other. Gates of the N-channel MOS transistors N1 and N2 are connected to each other. The gate and a drain of the P-channel MOS transistor P1 are connected to each other. The gate and a drain of the P-channel MOS transistor P3 are connected to each other. The gate and a drain of the N-channel MOS transistor N2 are connected to each other.

In FIG. 1, a startup circuit 200 according to the example provided in the constant current circuit 100 includes P-channel MOS transistors P5 and P6 and N-channel MOS transistors N3 and N4. A series circuit S3 including the P-channel MOS transistors P5, the P-channel MOS transistor P6, and the N-channel MOS transistor N3 is connected between the supply line L1 and the ground line L2 of the power supply voltage VDD.

In the startup circuit 200, a drain of the N-channel MOS transistor N4 is connected to the connection line (node V1) between the gate and the drain of the P-channel MOS transistor P3, a source of the N-channel MOS transistor N4 is connected to the connection line (node V2) between the drain of the P-channel MOS transistor P4 and the drain of the N-channel MOS transistor N2, and the gate of the N-channel MOS transistor N4 is connected to the connection line (node V3) between the drain of the P-channel MOS transistor P6 and the drain of the N-channel MOS transistor N3.

In addition, in the startup circuit 200, a gate of the P-channel MOS transistor P5 is connected to the connection line (node V4) between a drain of the P-channel MOS transistor P6 and the drain of the N-channel MOS transistor N3, the gate of the P-channel MOS transistor P6 is connected to the connection line (node V5) between the drain of the N-channel MOS transistor N4 and the node V1, and the gate of the N-channel MOS transistor N3 is connected to the connection line (node V6) between the drain of the P-channel MOS transistor P4 and a drain of the N-channel MOS transistor N2.

In the start startup circuit 200, the series circuit S3 including the P-channel MOS transistor P5, the P-channel MOS transistor P6, and the N-channel MOS transistor N3 provided between the supply line L1 and the ground line L2 of the power supply voltage VDD is equivalent to the "current path" in the invention (the series circuit S3 is referred to below as the "third current path S3"), the P-channel MOS transistor P5 is equivalent to the "first transistor", and the P-channel MOS transistor P6 is equivalent to the "second transistor". In addition, the N-channel MOS transistor N4 is equivalent to the "switching element" in the invention, the P-channel MOS transistor P6 is equivalent to "operating current limiting element", and a circuit configuration CB of the third current path S3 including the P-channel MOS transistor P5, the P-channel MOS transistor P6, and the N-channel MOS transistor N3 is equivalent to the "startup current cut-off circuit". This circuit configuration CB is referred to as the startup current cut-off circuit.

In the startup circuit 200, the N-channel MOS transistor N4 supplies a startup current Is for starting the constant current circuit 100 to the N-channel MOS transistor N2. The source of the N-channel MOS transistor N4 is connected to the gate (drain) of the N-channel MOS transistor N2 so as to turn off the N-channel MOS transistor N4 immediately after the starting. The N-channel MOS transistor N3 is used to turn off the N-channel MOS transistor N4 after the starting.

The drain current of the N-channel MOS transistor N3 is supplied from the diode-connected P-channel MOS transistor P5. However, even if the P-channel MOS transistor P5 is simply diode-connected, the drain current of the N-channel MOS transistor N3 becomes large when the power supply voltage VDD is 18V. Although an L length of the transistor size of the N-channel MOS transistor N3 may be increased to reduce the drain current of the N-channel MOS transistor N3, an increase in the chip size makes the cost higher.

Accordingly, after starting the constant current circuit 100, the example reduces a drain-source voltage Vds of the P-channel MOS transistor P5 by the P-channel MOS transistor P6, uses the linear region of the P-channel MOS transistor P5 instead of the saturation region, reduces the current flowing through the P-channel MOS transistor P5, and limits the drain current flowing through the N-channel MOS transistor N3.

The operation of the startup circuit 200 when the supply of power supply is started will be described below.

First, since the current of the N-channel MOS transistor N2 is zero, it is necessary to form the current path from the supply line L1 of the power supply voltage VDD to the ground line L2 via the P-channel MOS transistors P1 and P3, the N-channel MOS transistor N4, and the N-channel MOS transistor N2 in order to exit from the state in which the current is zero. The gate voltage of the N-channel MOS transistor N4 becomes close to the power source via the P-channel MOS transistor P5 immediately after the constant current circuit 100 is started. This turns on the N-channel MOS transistor N4 and connects the gate (node V1) of the P-channel MOS transistor P3 to the gate (node V2) of the N-channel MOS transistor N2.

That is, the voltages of the nodes V1 to V6 are close to 0 V before the power is turned on. Therefore, when the supply of the power supply voltage VDD to the constant current circuit 100 is started, the P-channel MOS transistors P5 and P6 are turned on, the voltage (that is, the gate voltage of the N-channel MOS transistor N4) of the node V3 rises, and the N-channel MOS transistor N4 is turned on. This feeds the startup current Is through the path including the P-channel MOS transistor P1, the P-channel MOS transistor P3, the N-channel MOS transistor N4, and the N-channel MOS transistor N2.

Since the constant current circuit 100 operates as a current mirror once a current flows through the N-channel MOS transistor N2, a current mirror current IR flowing through the second current path S2 including the P-channel MOS transistor P2, the P-channel MOS transistor P4, and the N-channel MOS transistor N2 equals the current value determined by the transistor size and the resistance value. At this time, the N-channel MOS transistor N3 is turned on when the gate voltage of the N-channel MOS transistor N3 rises, and the operation of the N-channel MOS transistor N4 as a switch stops by setting the size of the N-channel MOS transistor N3 so as to enable driving exceeding the current supplied from the P-channel MOS transistor P5.

That is, when the constant current circuit 100 starts by receiving the supply of the startup current Is, the current mirror current IR flowing through the second current path S2 raises the voltage (that is, the gate voltage of the N-channel MOS transistor N3) of the node V6 and the N-channel MOS transistor N3 is turned on. This feeds an operating current Ix through the third current path S3 including the P-channel MOS transistor P5, the P-channel MOS transistor P6, and the N-channel MOS transistor N3. This reduces the voltage (the gate voltage of the N-channel MOS transistor N4) of the node V3, turns off the N-channel MOS transistor N4, and cuts off the supply of the startup current Is to the constant current circuit 100.

When only the transistor size is used to make determination so that the power driving capability of the N-channel MOS transistor N3 becomes higher than the current value of the P-channel MOS transistor P5 in order to operate the startup circuit 200 at wide power supply voltages, variation error becomes large. The example reduces the drain-source voltage Vds of the P-channel MOS transistor P5 by controlling the gate voltage of the P-channel MOS transistor P6 using the bias voltage during operation of the constant current circuit 100. The P-channel MOS transistor P5 enters the linear region when the drain-source voltage Vds reduces, and the current flowing through it reduces.

That is, when the operating current Ix flows through the third current path S3 to turn off the N-channel MOS transistor N4, the voltage (the gate voltage of the P-channel MOS transistor P6) of the node V5 equals the voltage (that is, the bias voltage during operation of the constant current circuit 100) defined by a current mirror current IL flowing through the path (that is, the first current path S1) including the P-channel MOS transistor P1, the P-channel MOS transistor P3, the N-channel MOS transistor N1, and the resistor R1. This reduces a gate-source voltage Vgs of the P-channel MOS transistor P6, increases the electropotential of the source of the P-channel MOS transistor P6, reduces the drain-source voltage Vds of the P-channel MOS transistor P5, causes the P-channel MOS transistor P5 to enter the linear region, and reduces the current flowing through the P-channel MOS transistor P5.

As described above, after the N-channel MOS transistor N4 is turned off, the drain current flowing through the N-channel MOS transistor N3 is limited (that is, the operating current Ix flowing through the third current path S3 is limited), and the voltage (the gate voltage of the N-channel MOS transistor N4) of the node V3 in the third current path S3 does not exceed the threshold voltage of the N-channel MOS transistor N4 over a wide range of power supply voltages VDD, thereby turning off the N-channel MOS transistor N4 surely.

That is, since the N-channel MOS transistor N4 always needs to be turned off after the constant current circuit 100 is started, the operating current Ix always flows through the third current path S3. In this case, since the current of the P-channel MOS transistor P5 is reduced by the P-channel MOS transistor P6 in the example, the operating current Ix flowing through the third current path S3 is reduced. Accordingly, the voltage of the node V3 in the third current path S3 does not exceed the threshold voltage of the N-channel MOS transistor N4 over a wide range of power supply voltages VDD, thereby turning off the N-channel MOS transistor N4 surely.

As described above, in the startup circuit 200 according to the example, after the startup current Is to the constant current circuit 100 is cut off by turning off the N-channel MOS transistor N4, the operating current Ix flowing through the third current path S3 is limited, the voltage of the node V3 in the third current path S3 does not exceed the threshold voltage of the N-channel MOS transistor N4 over a wide range of power supply voltages VDD, the N-channel MOS transistor N4 is turned off surely, thereby widening the use range of the power supply voltage VDD. In addition, since the operating current Ix flowing through the third current path S3 is limited in the example, the power consumption also reduces. In addition, the size of the N-channel MOS transistor N3 can be reduced, thereby enabling cost reduction.

Simulation Results

The presence or absence of the startup circuit 200 was simulated together to check the effects of the startup circuit 200 according to the example. First, DC analysis that analyzes the current flowing through the constant current circuit 100 by applying the power supply voltage VDD from 0 V to 18 V in a DC manner was performed.

Figure 2A:
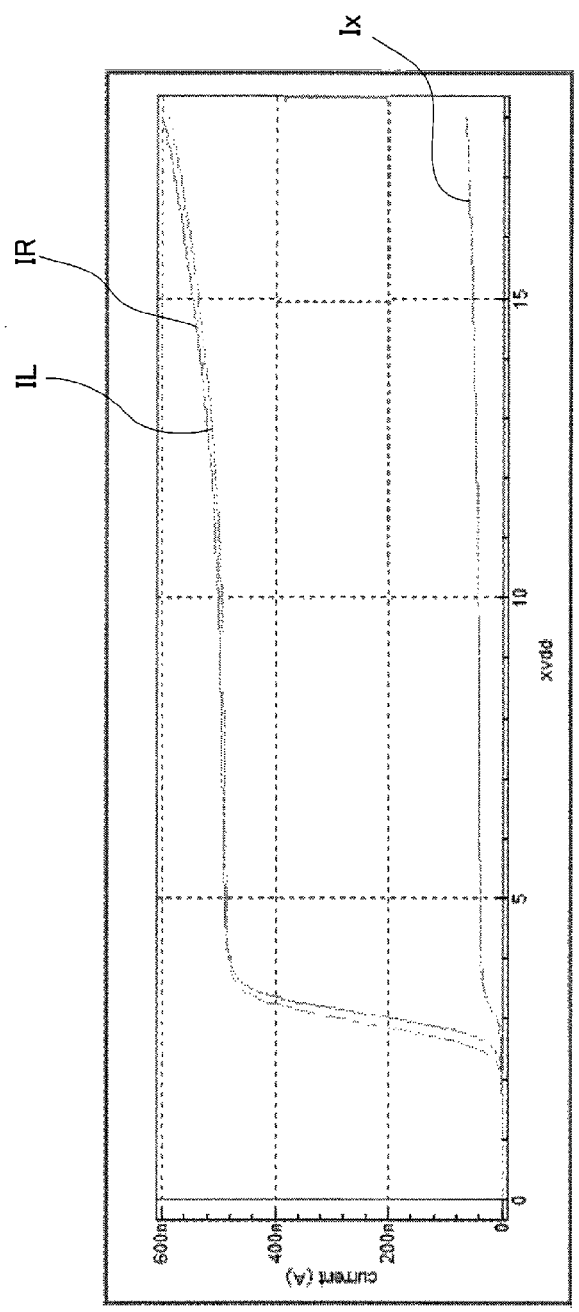
FIG. 2A illustrates changes in the current mirror current when the constant current circuit having the startup circuit according to the example is started.
Figure 2B:
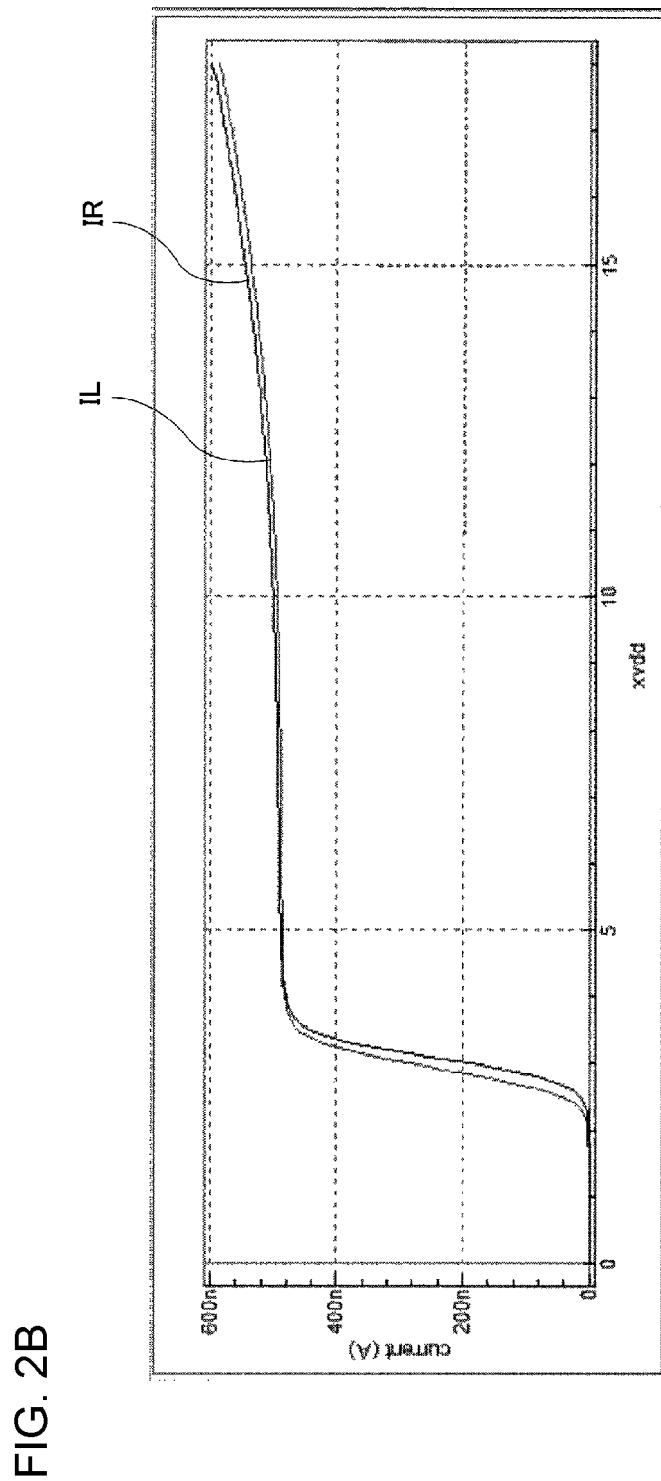
FIG. 2B illustrates changes in the current mirror current when the constant current circuit not having the startup circuit according to the example is started.

FIG. 2A illustrates the current mirror currents IL and IR when the startup circuit 200 is present and FIG. 2B illustrates the current mirror currents IL and IR when the startup circuit 200 is not present. FIG. 2A also illustrates the operating current Ix flowing through the third current path S3.

As illustrated by the waveforms of the current mirror currents IL and IR in FIGS. 2A and 2B, there are no differences between presence and absence of the startup circuit 200. That is, it is found that the startup circuit 200 has no effects on the current value of the constant current circuit 100 having been started.

Figure 3A:
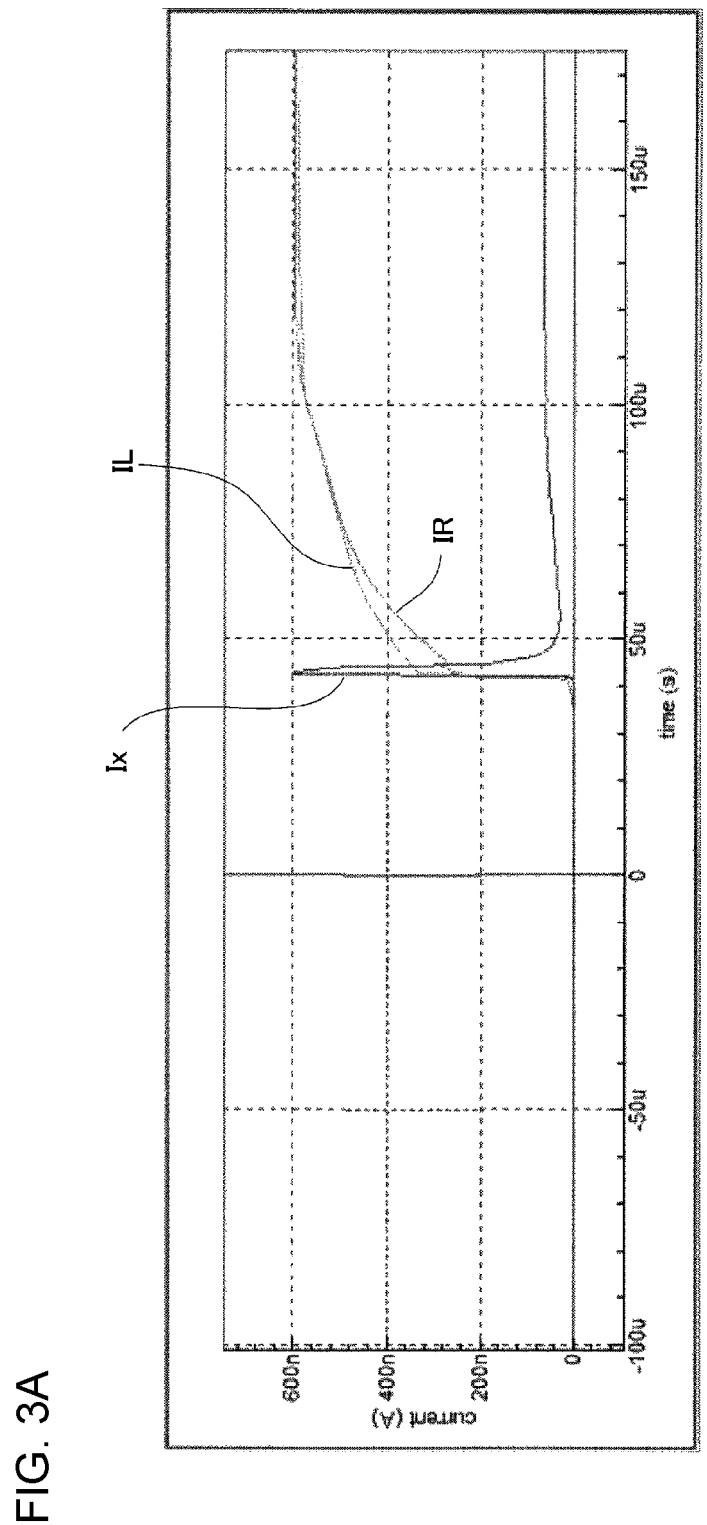
FIG. 3A illustrates changes in the current mirror current, the operating current, and the startup current when the constant current circuit including the startup circuit according to the example is started.
Figure 3B:
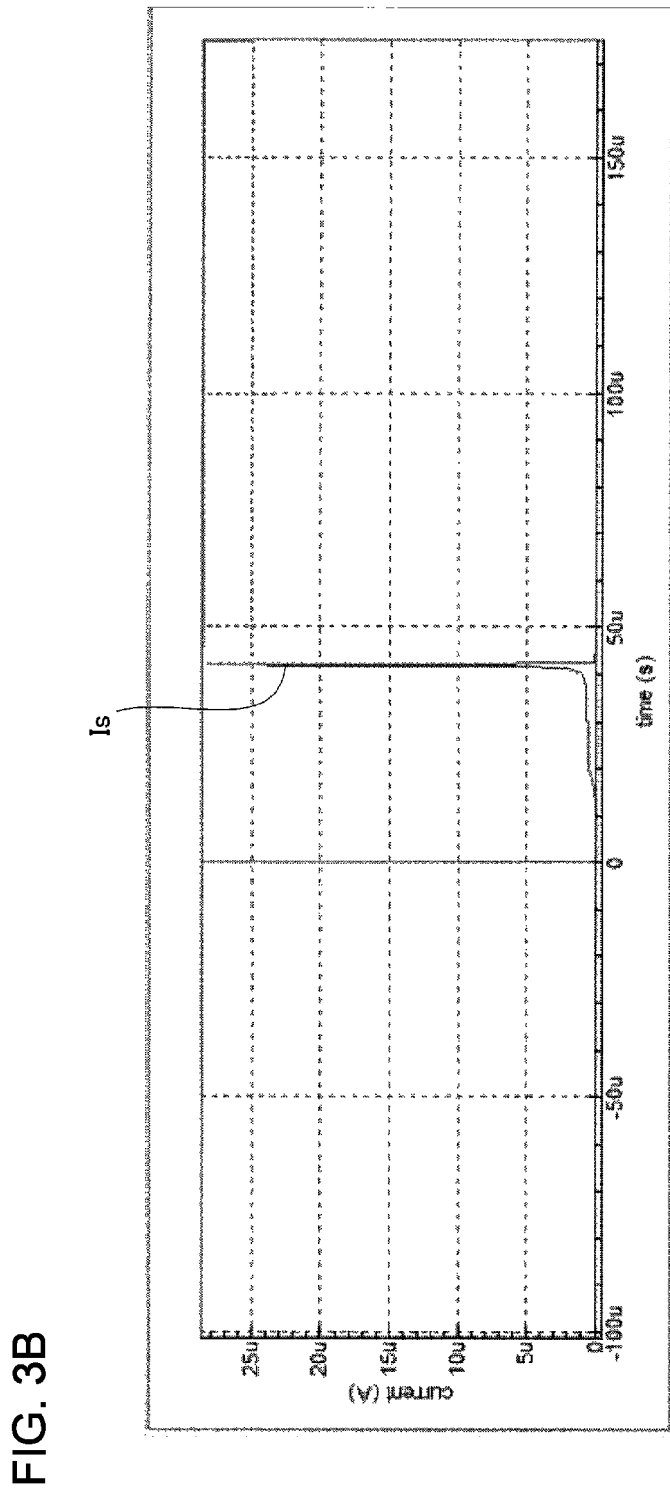
FIG. 3B illustrates changes in the current mirror current, the operating current, and the startup current when the constant current circuit including the startup circuit according to the example is started.

Next, transient analysis of the constant current circuit 100 including the startup circuit 200 when the power supply voltage VDD changes from 0 V to 18 V was performed. Here, transient analysis in which the power supply voltage VDD was raised for 100 μs was performed. FIG. 3A illustrates the current mirror currents IL and IR and the operating current Ix immediately after the starting and FIG. 3B illustrates the startup current Is immediately after the starting.

When the N-channel MOS transistor N4 of the startup circuit 200 is turned on, the startup current Is flows and the constant current circuit 100 starts, thereby turning on the N-channel MOS transistor N3. It can be seen that, when the N-channel MOS transistor N3 is turned on, the N-channel MOS transistor N4 is turned off, the supply of the startup current Is to the constant current circuit 100 is cut off, the operating current Ix flowing through the third current path S3 is limited by the P-channel MOS transistor P6 that receives the bias voltage at this time from the constant current circuit 100 as the gate voltage.

Figure 4:
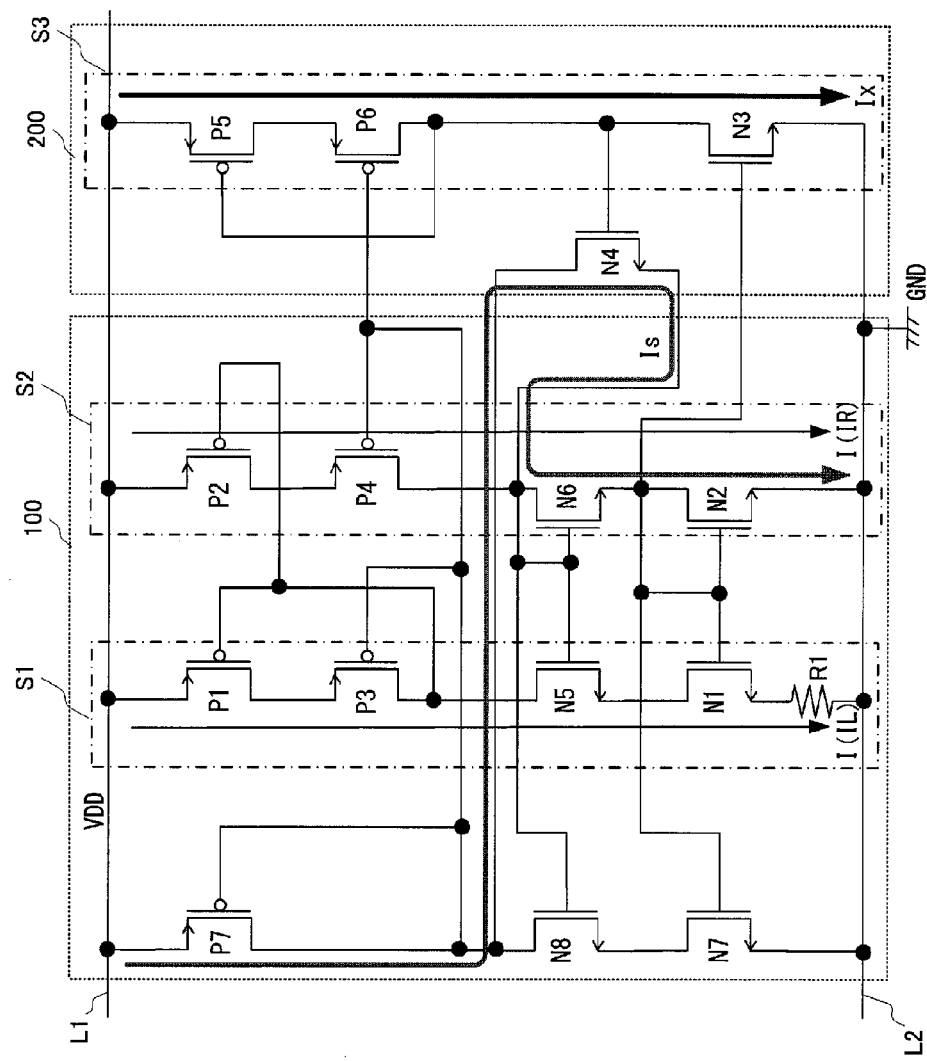
FIG. 4 illustrates another circuit configuration of the constant current circuit including the startup circuit according to the examples.
Figure 5:
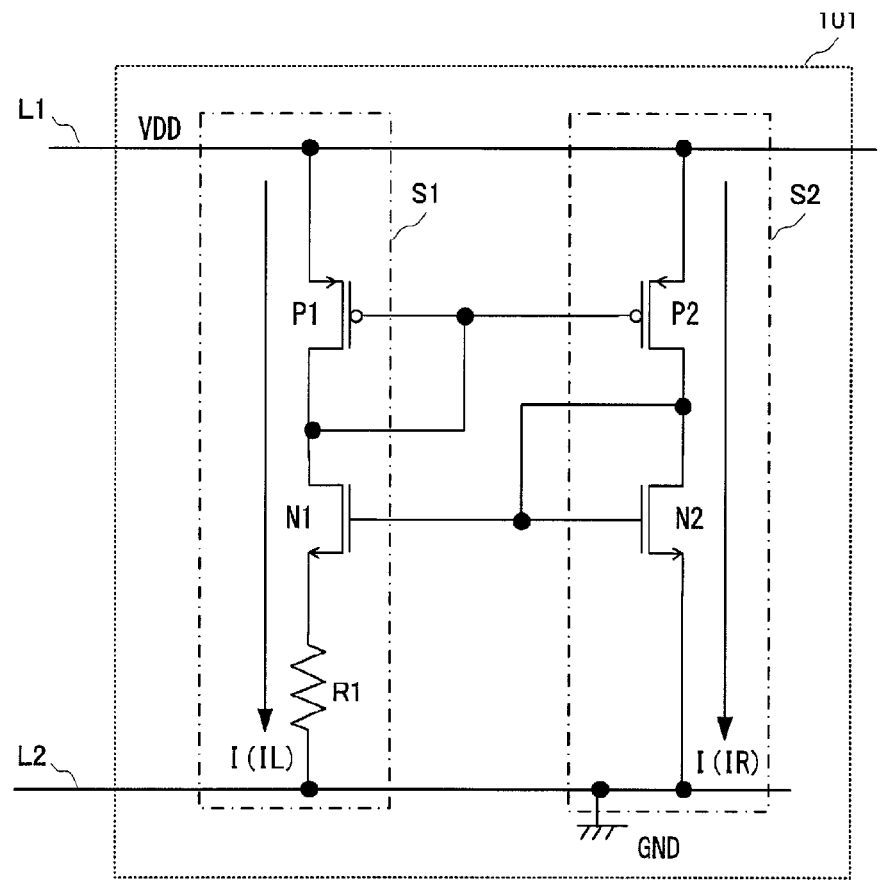
FIG. 5 illustrates an example of a constant current circuit using an electropotential difference caused by the source resistor of a current mirror.
Figure 6:
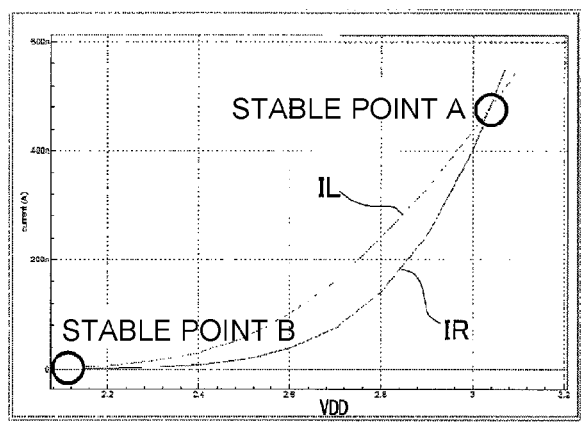
FIG. 6 illustrates two stable points in the constant current circuit illustrated in FIG. 5.
Figure 7:
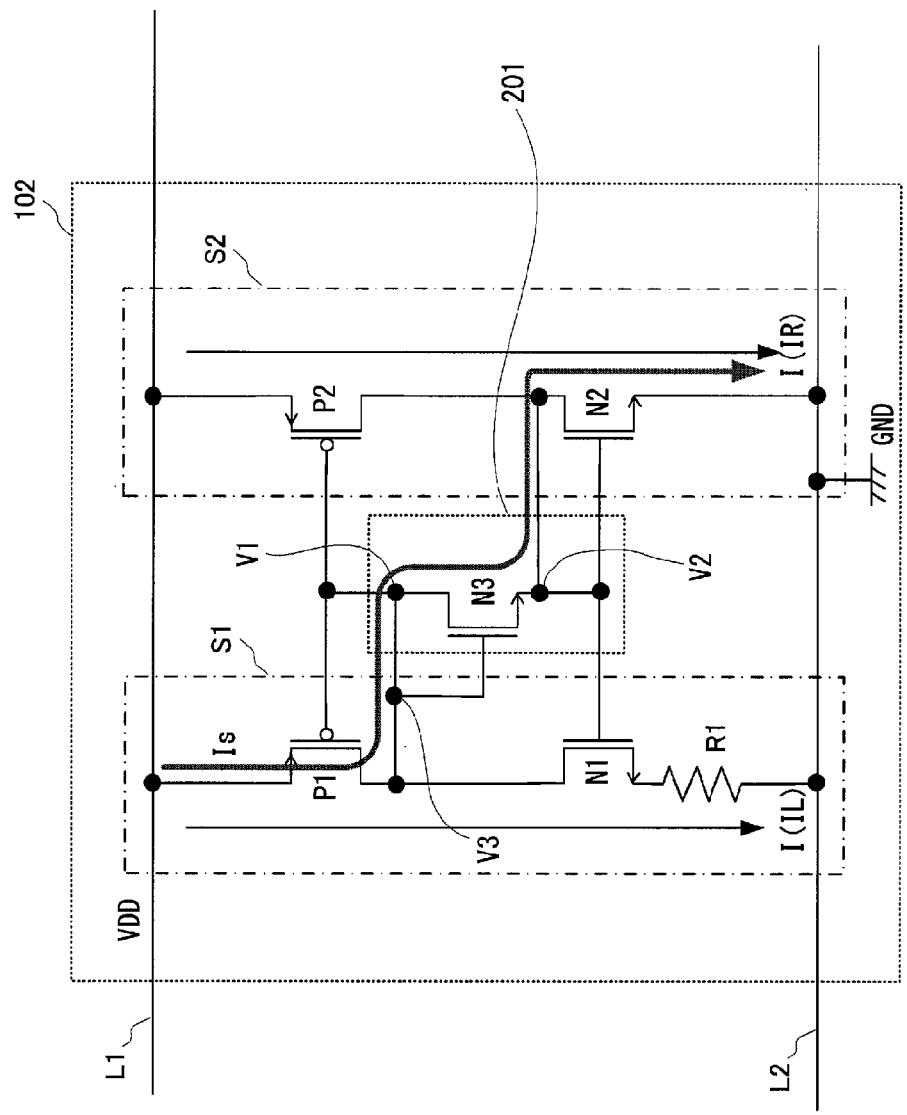
FIG. 7 illustrates a constant current circuit (conventional example 1) including the conventional startup circuit.
Figure 8:
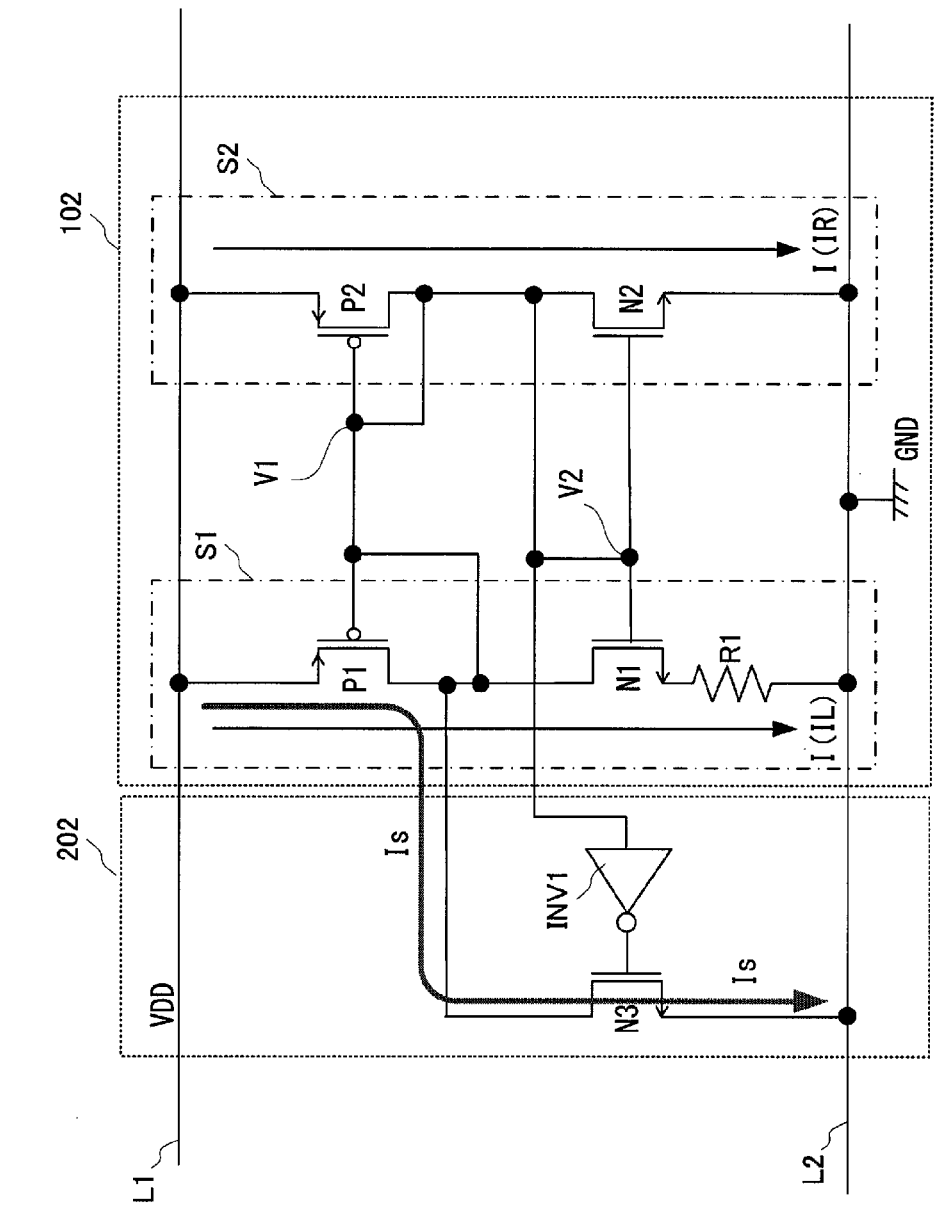
FIG. 8 illustrates a constant current circuit (conventional example 2) including another example of the conventional startup circuit.
Figure 9:
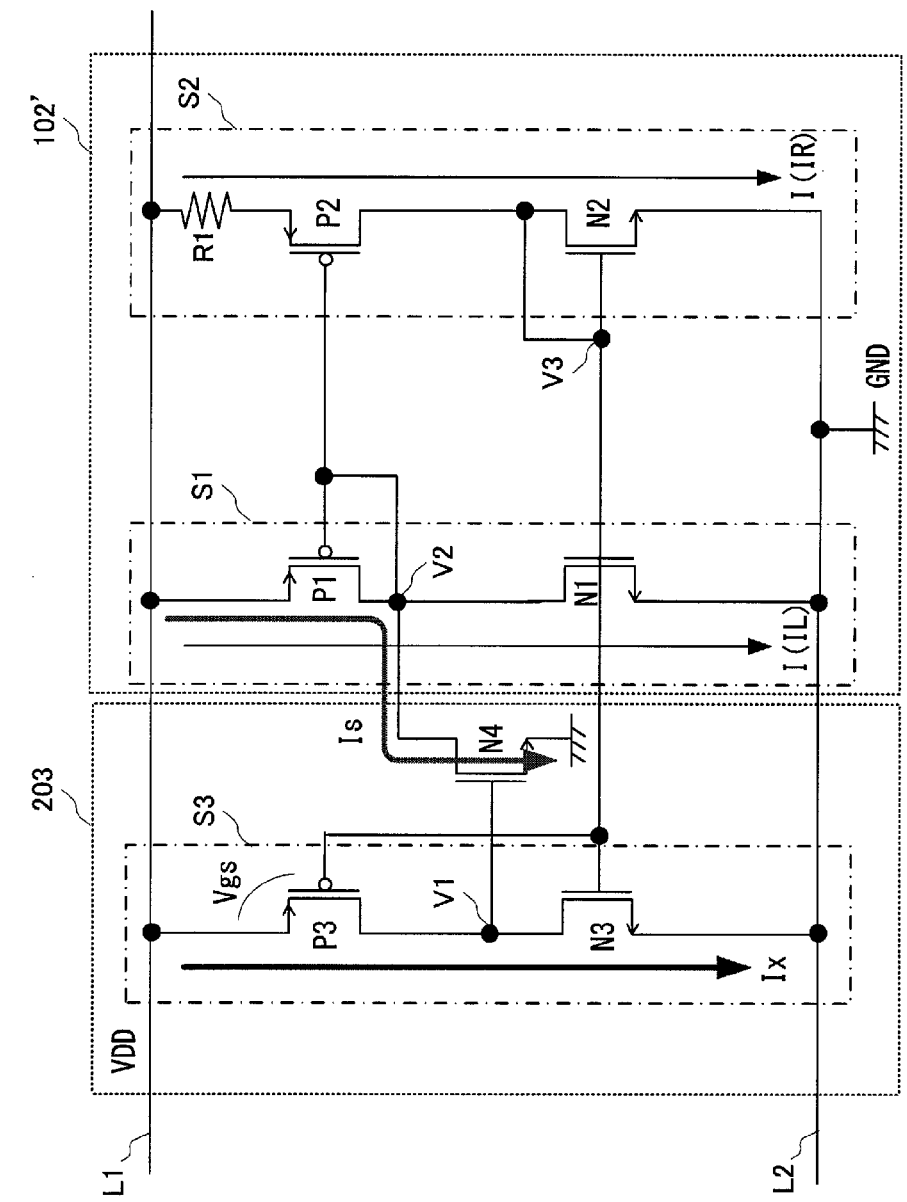
FIG. 9 illustrates a constant current circuit (conventional example 3) including another example of the conventional startup circuit.

The simplest form has been indicated as the circuit configuration of the constant current circuit 100 including the startup circuit 200 in the above example for simplicity of description. However, more practically, N-channel MOS transistors may be of cascode type to improve the characteristics of the current mirror. FIG. 4 illustrates the circuit configuration when N-channel MOS transistors of cascode type are used in the constant current circuit 100.

In FIG. 4, transistors the same as in FIG. 3 are given the same reference numerals. In FIG. 4, the constant current circuit 100 is a well-known cascode type current mirror circuit to widen the operation range of the power supply voltage VDD. In the constant current circuit 100, the circuit including a P-channel MOS transistor P7, an N-channel MOS transistor N8, and an N-channel MOS transistor N7 connected in series is connected between the supply line L1 and the ground line L2 of the power supply voltage VDD so as to set the gate voltage of the P-channel MOS transistor P3 using the P-channel MOS transistor P7. In addition, the output resistance of the current mirror is increased by adding N-channel MOS transistors N5 and N6 to reduce the effects of fluctuations in the power supply voltage VDD. In addition, the voltage of the connection point between the gate of the N-channel MOS transistor N1 and the gate of the N-channel MOS transistor N2 and the voltage of the connection point between the gate of the N-channel MOS transistor N5 and the gate of the N-channel MOS transistor N6 are applied to the gates of N-channel MOS transistors N7 and N8 as the bias voltages. In addition, the gate of the P-channel MOS transistor P1 is connected to the drain of the P-channel MOS transistor P3 instead of being connected to the drain of the P-channel MOS transistor P1 to form diode-connection. In addition, the gate of the P-channel MOS transistor P3 is connected to the drain of the P-channel MOS transistor P7.

In this circuit configuration, the startup current Is flows through the path including the P-channel MOS transistor P7, the N-channel MOS transistor N4, the N-channel MOS transistor N6, and the N-channel MOS transistor N2 and, as in FIG. 3, the operating current Ix flows through the path including the P-channel MOS transistor P5, the P-channel MOS transistor P6, and the N-channel MOS transistor N3.

The circuit configuration illustrated in FIG. 4 is a modification for widening the setting range of the power supply voltage VDD and reducing effects of current fluctuations caused by power fluctuations. Although this modification changes the path of the startup current, it does not change the essence of the operation of the invention at all in which a flow of a startup current is stopped after steady operation and the cut-off current is also reduced.

Expansion of the Example

Although the invention has been described above with reference to the above example, the invention is not limited to the above example. Various changes understandable to those skilled in the art can be made to the structure and details of the invention within the technical concept of the invention.

The invention can be used as a startup circuit that supplies a startup current to a constant current circuit for generating a constant current when the supply of a power supply voltage to the constant current circuit is started.

The invention claimed is:

1. A startup circuit performing supply of a startup current to a constant current circuit generating a constant current by receiving supply of a power supply voltage when starting the supply of the power supply voltage to the constant current circuit, the startup circuit comprising:
    a switching element that is turned on when the supply of the power supply voltage is started and performs the supply of the startup current to the constant current circuit; and
    a startup current cut-off circuit cutting off the supply of the startup current to the constant current circuit by turning off the switching element after the constant current circuit is started,
    wherein the startup current cut-off circuit comprises:
        a current path through which a current turning off the switching element flows as an operating current; and
        an operating current limiting element limiting the operating current flowing through the current path after the switching element is turned off since the operating current flows through the current path.

2. The startup circuit according to claim 1, wherein the operating current limiting element limits the operating current flowing through the current path by receiving a bias voltage during operation of the constant current circuit after the switching element is turned off.

3. The startup circuit according to claim 2, wherein the current path comprises a first transistor and a second transistor connected in series,
    wherein the operating current limiting element is the second transistor in the current path, and,
    wherein in the first transistor and the second transistor, a gate of the first transistor is connected to a drain of the second transistor, a drain of the first transistor is connected to a source of the second transistor, and the bias voltage during operation of the constant current circuit is applied to a gate of the second transistor.

4. The startup circuit according to claim 1, wherein the switching element is a transistor.

* * * * *